US012650534B2

(12) United States Patent (10) Patent No.: US 12,650,534 B2
Yarman et al. (45) Date of Patent: Jun. 9, 2026

(54) AUTOMATED DETERMINATION OF AN NMR PULSE SEQUENCE

(71) Applicant: Schlumberger Technology Corporation, Sugar Land, TX (US)

(72) Inventors: Can Evren Yarman, Paris (FR); Albina Mutina, Paris (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 162 days.

(21) Appl. No.: 18/806,781

(22) Filed: Aug. 16, 2024

(65) Prior Publication Data

US 2025/0060505 A1     Feb. 20, 2025

(30) Foreign Application Priority Data

Aug. 18, 2023     (EP) ..................................... 23306391

(51) Int. Cl.
| | |
|---|---|
| *G01V 3/32* | (2006.01) |
| *E21B 49/00* | (2006.01) |
| *G01R 33/38* | (2006.01) |
| *G01R 33/54* | (2006.01) |
| *G01R 33/56* | (2006.01) |

(52) U.S. Cl.
CPC ................ *G01V 3/32* (2013.01); *E21B 49/00* (2013.01); *G01R 33/3808* (2013.01); *G01R 33/543* (2013.01); *G01R 33/5608* (2013.01)

(58) Field of Classification Search
CPC .......... G01V 3/32; G01V 3/14; G01N 24/081; G01N 24/08; G01R 33/50; G01R 33/3808; G01R 33/448; G01R 33/543; G01R 33/5608; E21B 49/00
See application file for complete search history.

(56) References Cited

U.S. PATENT DOCUMENTS

| | | | | |
|---|---|---|---|---|
| 9,726,739 | B2 * | 8/2017 | Grodzki | ............... G01R 33/543 |
| 2015/0323698 | A1 | 11/2015 | Mandal | |
| 2016/0077183 | A1 | 3/2016 | Jachmann | |
| 2017/0176626 | A1 | 6/2017 | Paulsen | |
| 2021/0003734 | A1 | 1/2021 | Heaton | |
| 2021/0231762 | A1 * | 7/2021 | Fritz | .................... G01R 33/543 |
| 2022/0236443 | A1 | 7/2022 | Edwards | |
| 2022/0357415 | A1 * | 11/2022 | Wu | ..................... G01R 33/5659 |

OTHER PUBLICATIONS

Yarman et al., A greedy variational approach for generating sparse T1-T2 NMR relaxation time distributions. Journal of Magnetic Resonance, 2019, 301, 94-101.
Huang, Z. et al., "Single-pass Object-adaptive Data Undersampling and Reconstruction for MRI", IEEE Transactions on Computational Imaging, 2022, 8, pp. 1-19.

* cited by examiner

*Primary Examiner* — Rishi R Patel
(74) *Attorney, Agent, or Firm* — Jeffrey D. Frantz

(57)     ABSTRACT

A method for automatically determining an NMR pulse sequence for use in downhole NMR measurements, such as NMR logging while drilling measurements, includes receiving a set of expected NMR measurements and evaluating the received set of expected NMR measurements using a bilevel optimization to determine a pulse sequence for the downhole NMR measurement.

14 Claims, 4 Drawing Sheets

$$M_0 \left[ 1 - \exp\left( -\frac{WT}{T_1} \right) \right]$$

$$\exp\left( -\frac{NE,TE}{T_2} \right)$$

WT

TCPMG

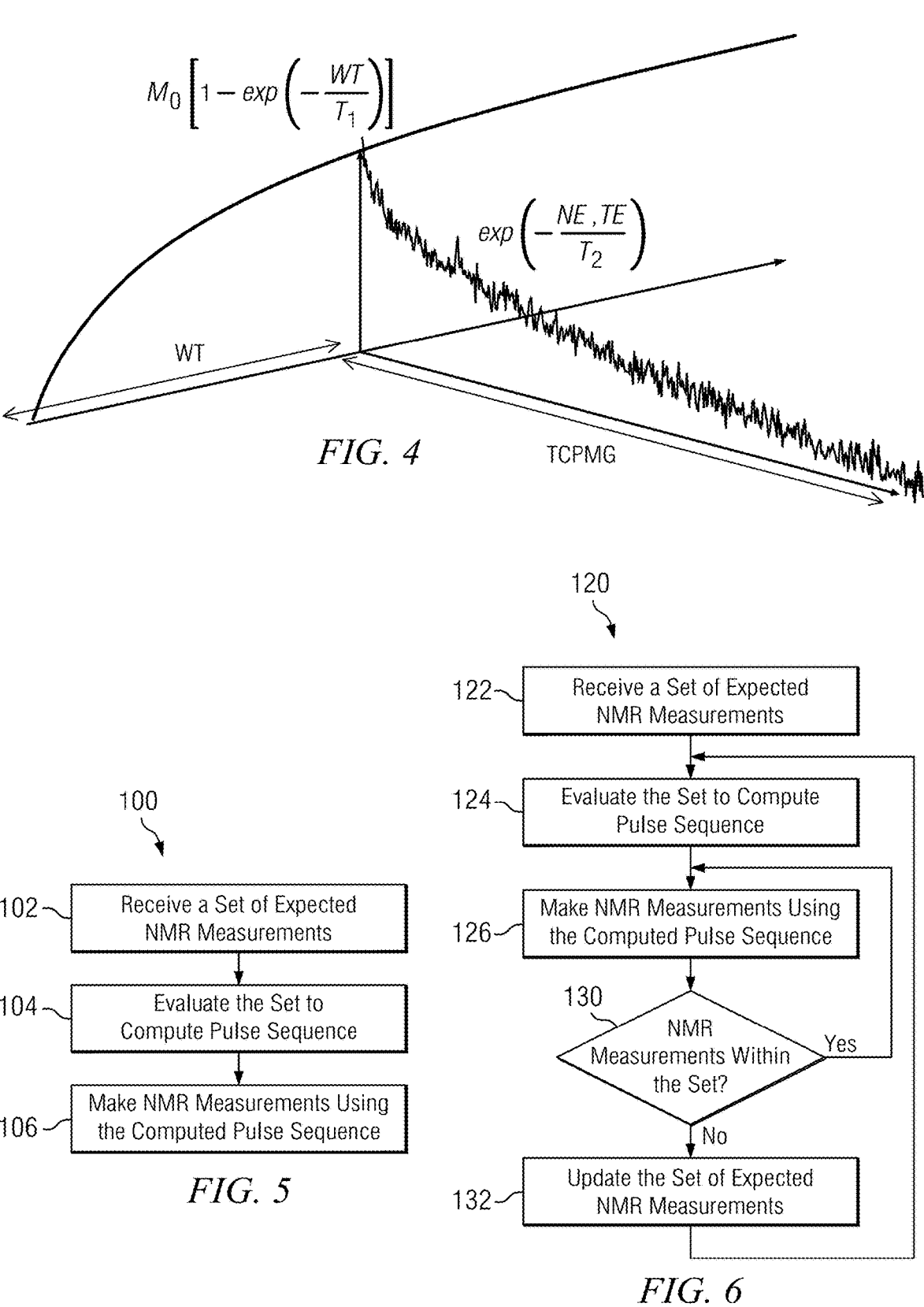

$$M_0 \left[ 1 - exp\left( -\frac{WT}{T_1} \right) \right]$$

$$exp\left( -\frac{NE,TE}{T_2} \right)$$

WT

TCPMG

102 — Receive a Set of Expected NMR Measurements

104 — Evaluate the Set to Compute Pulse Sequence

106 — Make NMR Measurements Using the Computed Pulse Sequence

122 — Receive a Set of Expected NMR Measurements

124 — Evaluate the Set to Compute Pulse Sequence

126 — Make NMR Measurements Using the Computed Pulse Sequence

130 — NMR Measurements Within the Set? — Yes

No

132 — Update the Set of Expected NMR Measurements

AUTOMATED DETERMINATION OF AN NMR PULSE SEQUENCE

CROSS REFERENCE TO RELATED APPLICATIONS

This application claims the benefit of EP Application No. 23306391.6, entitled "AUTOMATED DETERMINATION OF AN NMR PULSE SEQUENCE" filed Aug. 18, 2023, the disclosure of which is hereby incorporated herein by reference.

BACKGROUND

Nuclear Magnetic Resonance (NMR) logging tools are commonly used to measure properties of earth formations, such as the fractional volume of pore space, the fractional volume of mobile fluid filling the pore space, and the porosity of earth formations. NMR measurements may also be used to assess the content of brine and hydrocarbons in the formation. The signals measured by NMR logging tools arise from selected nuclei in the probed volume. Since hydrogen nuclei are the most abundant and easily detectable, most NMR logging tools are tuned to detect hydrogen resonance signals (e.g., from either water or hydrocarbons).

The probed hydrogen nuclei have different dynamic properties (e.g., diffusion rate and tumbling/rotation rate) that are dependent on their environments, such as the chemical structure and size of the molecules in which they reside. The different dynamic properties of these nuclei manifest themselves in different nuclear spin relaxation times (i.e., spin-lattice relaxation time (referred to herein as T1) and spin-spin relaxation time (referred to herein as T2). For example, molecules in viscous oils cannot diffuse or tumble as fast as those in light oils. As a result, the heavy oils have relatively short T1 and T2 relaxation times.

NMR measurements are commonly made while drilling. One difficulty with making NMR measurements is determining the NMR acquisition pulse sequence used to obtain the NMR measurements. This can be a particularly challenging task for multi-dimensional NMR acquisition modes (e.g., in which both T1 and T2 distributions are measured). The design and optimization of an NMR pulse sequence design is commonly accomplished manually by experts. There is a need in the industry for automated methods and systems for determining suitable NMR pulse sequences from modelled or previously obtained NMR measurements.

BRIEF DESCRIPTION OF THE DRAWINGS

For a more complete understanding of the disclosed subject matter, and advantages thereof, reference is now made to the following descriptions taken in conjunction with the accompanying drawings, in which:

FIG. 4 depicts a portion of an example NMR signal obtained using the pulse sequence of FIG. 3.

FIG. 5 depicts a flow chart of one example method for automatically determining an NMR pulse sequence.

FIG. 6 depicts a flow chart of another example method for automatically determining an NMR pulse sequence.

DETAILED DESCRIPTION

A method and system for automatically determining an NMR pulse sequence for use in downhole NMR measurements such as NMR logging while drilling measurements are disclosed. One example method includes receiving a set of expected NMR measurements and evaluating the received set of expected NMR measurements using a bilevel optimization to determine a pulse sequence for the downhole NMR measurement, the pulse sequence defining a timing sequence of a transmission of radio-frequency (RF) pulses during the downhole NMR measurement.

Figure 1:
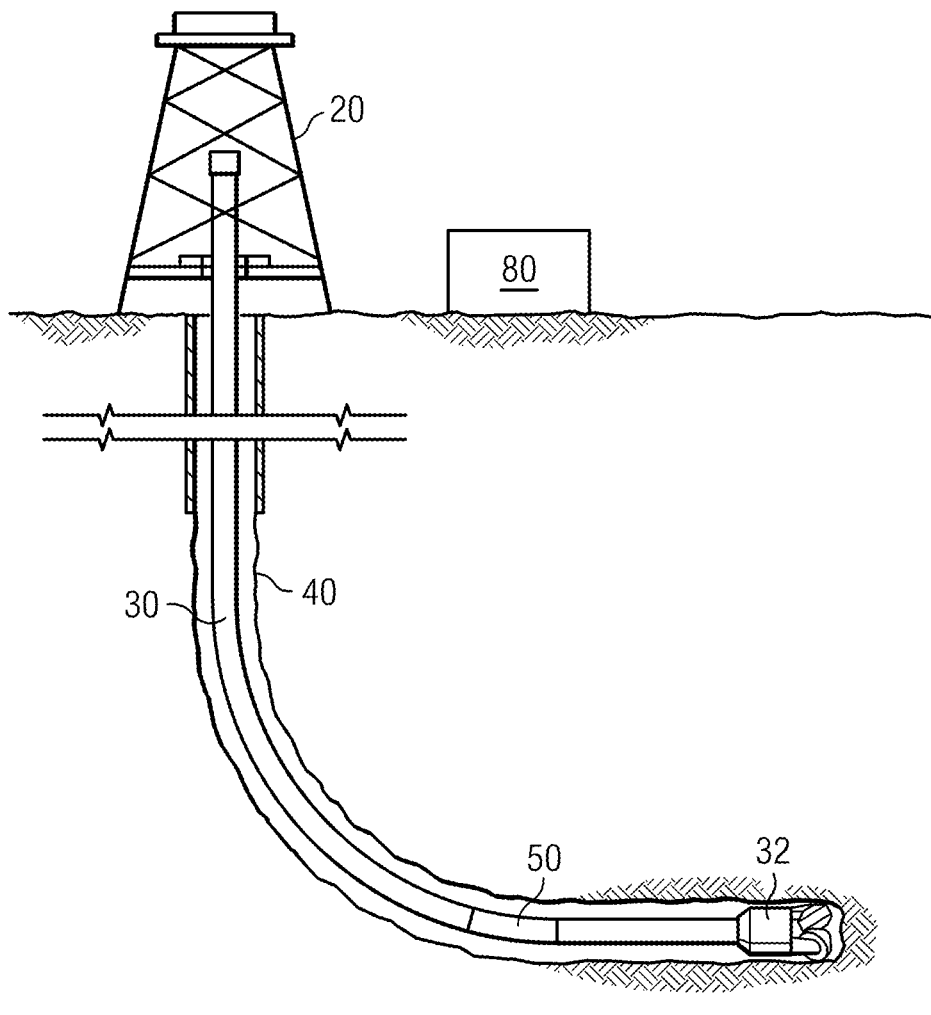
FIG. 1 depicts an example drilling system incorporating a disclosed NMR logging embodiment.

FIG. 1 depicts a schematic drilling rig 20 including a drill string 30 and an NMR logging tool 50 deployed in the string and disposed within a wellbore 40. The drilling rig 20 may be deployed in either onshore or offshore applications (an onshore application is depicted). In this type of system, the wellbore 40 may be formed in subsurface formations by rotary drilling in a manner that is well-known to those or ordinary skill in the art (e.g., via well-known directional drilling techniques).

As is known to those of ordinary skill, the drill string 30 may be rotated, for example, at the surface to drill the well (e.g., via a rotary table). A pump may deliver drilling fluid to the interior of the drill string 30 thereby causing the drilling fluid to flow downwardly through the drill string 30. The drilling fluid exits the drill string 30, e.g., via ports in a drill bit 32, and then circulates upwardly through the annulus region between the outside of the drill string 30 and the wall of the wellbore 40. In this known manner, the drilling fluid lubricates the drill bit 32 and carries formation cuttings up to the surface.

In the illustrated embodiment, the NMR logging tool may be deployed in a bottom hole assembly (BHA) including, for example, a rotary steerable system (RSS), a motor, drill bit 32, a measurement while drilling (MWD) tool, and/or one or more other logging-while-drilling (LWD) tools. The LWD tools may be configured to measure one or more properties of the formation through which the wellbore penetrates, for example, including resistivity, density, porosity, sonic velocity, gamma ray counts, and the like. The MWD tool may be configured to measure one or more properties of the wellbore 40 as the wellbore as it is drilled or at any time thereafter. The physical properties may include pressure, temperature, wellbore caliper, wellbore trajectory (attitude), and the like. The disclosed embodiments are, of course, no limited to any particular BHA configuration or even to LWD operations. The disclosed embodiments are equally well suited for wireline logging operations.

With further reference to FIG. 1, drilling rig 20 may further include an onsite operations or oilfield evaluation facility 80 (e.g., a control room or a field office). In the depicted embodiment, the operations facility may include a system for evaluating NMR measurements including a computer or computer system. The computer system may include one or more processors (e.g., microprocessors) which may be connected to one or more data storage devices (e.g., hard drives or solid-state memory) and user interfaces as well as to cloud-based storage or additional processors. It will be further understood that the disclosed embodiments may include processor executable instructions stored in the data storage device. The executable instructions may be configured, for example, to execute methods 100, 120, and/or 140 to automatically determine an NMR pulse acquisition sequence as described in more detail below with respect to FIGS. 5-7. For example, the computer system may be configured to solve upper level and lower level optimization problems. It will of course be understood that the disclosed embodiments are not limited to the use of any particular computer hardware and/or software.

With continued reference to FIG. 1, the NMR logging tool 50 may include a detection coil (commonly referred to as an antenna) that may measure the properties of nuclear spins in the formation, such as the longitudinal (or spin-lattice) relaxation time T1, transverse (or spin-spin) relaxation time T2, and a diffusion coefficient D. Knowledge of these NMR properties may help aid in the determination of basic formation properties, such as permeability and porosity, as well as the fluid properties, such as fluid type and viscosity. Multi-dimensional NMR techniques, for example, those that measure distributions of two or more of T1, T2, and/or D may provide quantitative fractions of different fluids (e.g., oil, water, gas) and a better understanding of the diffusion properties of these fluids in the surrounding formation, including the effects of geometry and restricted diffusion.

As is known to those of ordinary skill in the art, NMR well logging includes generating a static magnetic field (the $B_0$ field) within a wellbore (e.g., under the earth's surface), applying a series of radio frequency (RF) electromagnetic pulses to the volume around the wellbore (the $B_1$ field), measuring signals (echoes) received in response to the RF pulses, and evaluating the received echoes to determine characteristics of the interrogation volume in proximity to the wellbore. The measured NMR characteristics commonly include distributions of T1, T2, and/or D as described above. In addition to these one-dimensional (1D) measurements of relaxation times and diffusion coefficients, NMR logs may also provide two-dimensional (2D) maps showing the relationship between diffusion and relaxation times (e.g., D-T1 or D-T2 maps) and the relationship between longitudinal and transverse relaxation times (e.g., T1-T2 maps). These maps may be used to determine formation properties, such as porosity and permeability, as well as fluid properties such as the saturation of oil, water and gas. These 2D maps often enable water, gas, and oil signals to be distinguished, which may enable saturation determinations. Moreover, evaluating the position of the oil signal on the map, may enable the viscosity of the oil to be estimated from various correlations to logarithmic mean relaxation times.

As described above, NMR measurements involve the application of a static $B_0$ magnetic field to the magnetic moments (spins) of atoms in the measured object (or measured volume). In general, the $B_0$ field causes the atoms in the interrogated volume to align along and oscillate (precess) about the axis of the applied magnetic field. NMR measures the return to the equilibrium of this static magnetization (i.e., relaxation) after applying a series of RF pulses to tip the magnetization in a direction orthogonal to the static magnetic field. Longitudinal relaxation due to energy exchange between the spins of the atoms and the surrounding lattice (spin-lattice relaxation) is usually denoted by a time constant T1 when the longitudinal magnetization has returned to a predetermined percentage (i.e., 63%) of its final value. Longitudinal relaxation involves the component of the spin parallel or anti-parallel to the direction of the magnetic field. Transverse relaxation that results from spins getting out of phase is usually denoted by time constant T2 when the transverse magnetization has lost a predetermined percentage (i.e., 63%) of its original value.

Figures 2, 3:
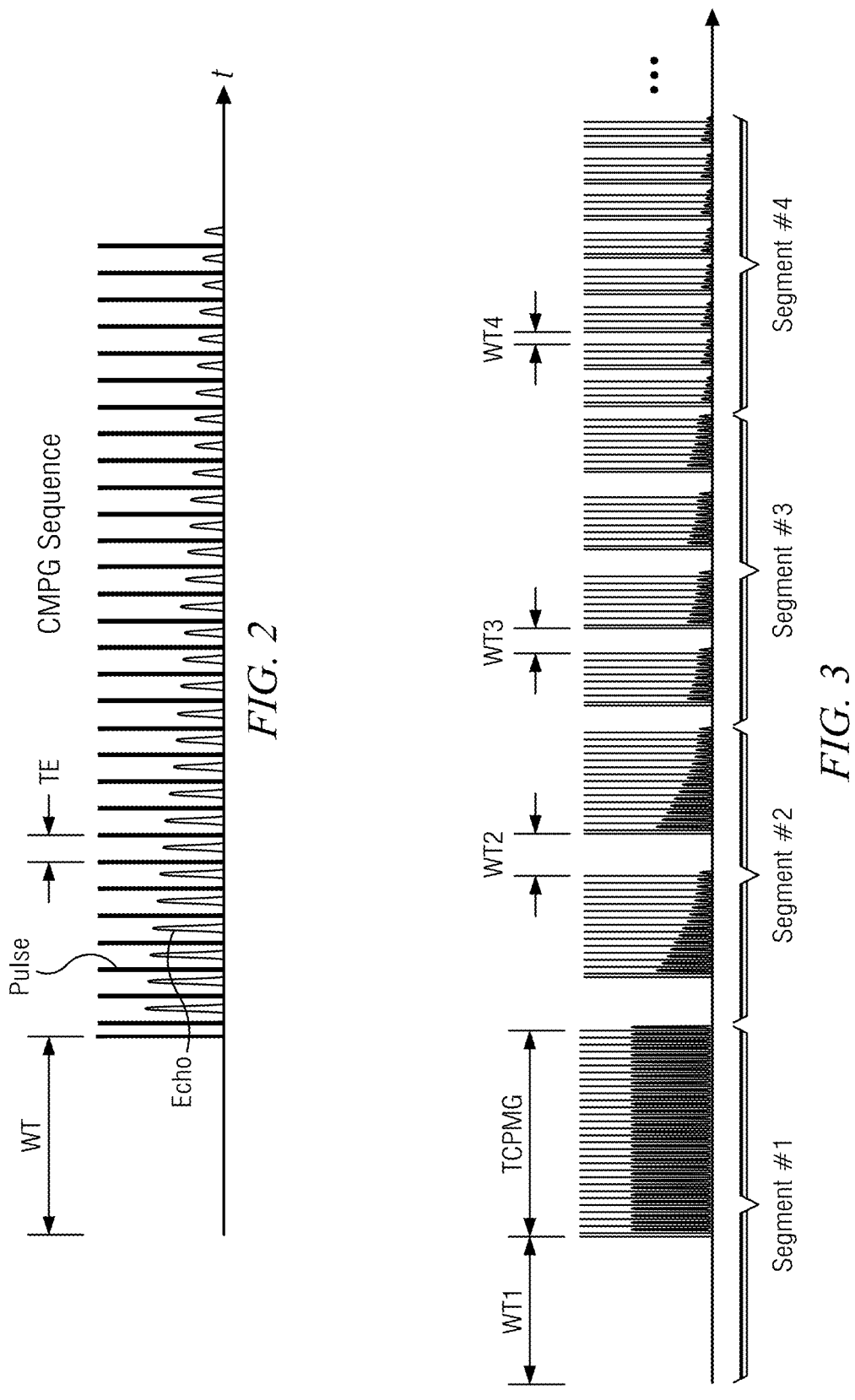
FIG. 2 depicts one example NMR pulse sequence.
FIG. 3 depicts another example NMR pulse sequence.

NMR measurements may be acquired using particular data acquisition schemes (commonly referred to as pulses or pulse sequences) which describe the sequence of transmission and reception of electromagnetic RF signals. A Carr-Purcell-Meiboom-Gill (CPMG) pulse sequence is commonly used to make downhole NMR measurements (e.g., to acquire the T2 relaxation time distribution). As depicted in FIG. 2, a CPMG pulse sequence (also referred to herein as an echo train) includes an initial idle time or wait time WT to allow the nuclei in the formation fluids to equilibrate with the static $B_0$ field. Thereafter, a series of RF pulses are applied using an antenna. At some time between adjacent RF pulses, NMR signals called echoes are formed and measured using the antenna (with the number of RF pulses and the corresponding acquired echoes being represented by $N_{ECHO}$ or NE). The time spacing between adjacent refocusing RF pulses is referred to as $T_{ECHO}$ or TE. The time spacing between the excitation pulse and the first refocusing pulse may commonly be set to TE/2. The amplitudes of the echoes decays or attenuates with time. By fitting the decaying echo amplitudes to a multi-exponential model, a T2 distribution may be obtained.

FIG. 3 depicts a common pulse sequence for measuring a T1-T2 map (or T1 and T2 distributions). The depicted sequence includes of a series of CPMG segments or subsequences (segment #s 1, 2, 3, and 4 in this example) with different wait times WT1, WT2, WT3, and WT4, different number of RF pulses $N_{ECHO}$, and different time spacing between adjacent pulses $T_{ECHO}$ to make measurements over a range of properties (as is commonly found in subterranean formations). For example, segment #1 having a long wait time WT1 may have sensitivity to longer T1 and T2 components but is often executed only once owing to the inherently longer measurement time. Segment #s 3 and 4, having short wait times WT3 and WT4, are often executed multiple times to ensure enough sensitivity to the shorter T1 and T2 components. In addition, the short segments often use a short $T_{ECHO}$ to capture short T2 components that decay quickly. It will, of course, be appreciated that the disclosed embodiments are not limited to any particular number of segments.

FIG. 4 depicts a diagram (or a plot) of an NMR signal obtained using a pulse sequence such as that depicted on FIG. 3. NMR measurements that make use of multiple CPMG pulse sequences may be characterized or modeled, for example, by following equation:

$$f(\tau_1, \tau_2) = \int f(T_1, T_2)\left(1 - c\exp\left(-\frac{\tau_1}{T_1}\right)\right)\exp\left(-\frac{\tau_2}{T_2}\right)dT_1 dT_2 \qquad (1)$$

where $f(T_1, T_2)$ represents the T1-T2 distribution of interest and $c \in [1,2]$ is a model parameter reflecting the quality of the experiment. In Eq. (1) $\tau_1$ represents the longitudinal recovery time and is equivalent to the wait time WT described above, and $\tau_2$ represents the transverse decay time and is equivalent to the product of the number of RF pulses $N_{ECHO}$ (NE) and the time spacing between adjacent pulses $T_{ECHO}$ (TE).

With continued reference to FIGS. 3 and 4, it will be appreciated that there are tradeoffs in selecting or designing a pulse sequence for making NMR measurements. For example, a long sequence having long wait times and a large number of RF pulses may provide good sensitivity to both long and short T1 and T2 components at the expense of poor temporal resolution. This can be particularly problematic in applications for which good temporal resolution is advantageous, such as LWD operations in which the NMR logging tool rotates and translates in the wellbore while drilling. In practice, the range of expected T1 and T2 values is often considered in designing an NMR pulse sequence. This process of optimizing the pulse acquisition sequence can be laborious and often requires NMR experts.

Turning now to FIG. 5, a flow chart of one example method 100 for automatically determining an NMR pulse sequence and making NMR measurements is depicted. A set of expected NMR measurements is received at 102. The set of expected NMR measurements may include, for example, a set of T1-T2 distributions that may be obtained, for example, from inverted NMR data/measurements or from a mathematical model. The set of expected NMR measurements generally corresponds to expected measurements from a set of samples of interest or a particular formation or formations of interest. The set of expected NMR measurements may be parameterized, for example, as described in more detail below. The disclosed embodiments are not limited in these regards.

Method 100 further includes solving an optimization problem at 104 to compute an advantageous pulse sequence for making the NMR measurements (e.g., an optimal pulse sequence). In certain advantageous embodiments, the optimization problem includes a bilevel optimization. The advantageous pulse sequence may include a set or range of wait times and a number of RF pulses. For example, the advantageous pulse sequence may include a range of wait times and a range of a product of the number of RF pulses $N_{ECHO}$ and the time spacing between adjacent pulses $T_{ECHO}$.

As further depicted in FIG. 5, the optimization at 104 may include a bilevel optimization having lower- and upper-level optimizations as described in more detail below. The lower-level optimization in the bilevel optimization may include a determination of optimal model parameters of a T1-T2 distribution, for a given acquisition setup (e.g., an optimum set of NMR measurements given a particular pulse sequence and an expected noise). The acquisition setup may include an optimum set of NMR acquisition parameters, such as a particular pulse sequence and an expected noise. The upper-level optimization in the bilevel optimization may include computing an optimum set of NMR acquisition parameters, such as a pulse sequence, such that the model parameters obtained from the lower level optimization using that acquisition parameters are within a predetermined threshold to the known model parameters of a T1-T2 distribution (or such that the difference between model parameters from the lower level optimization and the and the known model parameters is minimized). For a distribution of noise and model parameters, one may consider an expected performance over noise and model parameters in both lower-level and upper-level optimizations, respectively.

With continued reference to FIG. 5, method 100 may further optionally include making NMR measurements in a wellbore at 106 using the pulse sequence determined in 104. For example, a surface located processor or computer may receive the set of expected NMR measurements at 102 and compute the pulse sequence at 104 using the disclosed bilevel optimization methodology. The determined pulse sequence may then be transferred to a controller in a downhole (e.g., LWD or wireline) NMR tool. The tool may be deployed in a wellbore and used to make NMR measurements with the optimized pulse sequence. Received echoes (the NMR signal) may then be evaluated, for example, to determine NMR measurements such as T1, T2, and/or D distributions (e.g., to determine a T1-T2 map, a T1-D map, or T2-D map).

With still further reference to FIG. 5, and reference again to Eq. (1), it will be appreciated that $f(T_1,T_2)$ may be approximated by a Dirac distribution (see Yarman and Mitchell, 2019), for example as follows:

$$f(T_1, T_2) \approx \tilde{f}(T_1, T_2) = \sum_{m=1}^{M} a_m \delta(T_1 - T_{1,m})\delta(T_2 - T_{2,m}) \qquad (2)$$

for some $$(a_m, T_{1,m}, T_{2,m}) \in \mathbb{R}_+^3,$$

where $a_m$ represents the echo amplitudes and $\delta(t)$ represents the Dirac delta function. Now, consider the following approximate forward model $\tilde{F}[P_{\mathcal{M}}](\tau_1,\tau_2)$ for NMR data obtained by substituting equation (2) into (1):

$$F[P_{\mathcal{M}}](\tau_1, \tau_2) \approx \tilde{F}[P_{\mathcal{M}}](\tau_1, \tau_2) = \sum_{m=1}^{M} a_m\left(1 - c\exp\left(-\frac{\tau_{1,m}}{T_{1,m}}\right)\right)\exp\left(-\frac{\tau_{2,m}}{T_{2,m}}\right) \qquad (3)$$

where the model parameters $P_{\mathcal{M}}$ may be defined by a set or distribution of echo amplitudes, T1 relaxation times, and T2 relaxation times such that $$P_{\mathcal{M}} = \left(\{(a_m, T_{1,m}, T_{2,m})\}_{m=1}^{M}, c\right).$$

Based on Eq. (3), an inversion problem may be defined in which given the pulse acquisition parameters $$P_{\mathcal{A}} = \{(\tau_1, \tau_2)\}_{n=1}^{N}$$

in the pulse sequence and the measured NMR echoes $$S(P_{\mathcal{A}}) = \{S(\tau_{1,n}, \tau_{2,n})\}_{n=1}^{N}$$

the model parameters $P_{\mathcal{M}}$ that minimize the misfit $J_L$ $(S(P_{\mathcal{A}}),\tilde{F}[P_{\mathcal{M}}](P_A))$ between the NMR measurement and modeled measurement $$\tilde{F}[P_M](P_{\mathcal{A}}) = \{\tilde{F}[P_M](\tau_{1,n}, \tau_{2,n})\}_{n=1}^{N}$$

may be determined with respect to some misfit function $J_L$ along with constraints on $P_{\mathcal{M}}$ such as the cardinality of P is less than or equal to a constant M. A potential misfit function may include, for example, a least square error, such that:

$$J_L(S(P_{\mathcal{A}}), \tilde{F}[P_{\mathcal{M}}](P_A)) = \sum_{n=1}^{N} (S(\tau_{1,n}, \tau_{2,n}) - \tilde{F}[P_{\mathcal{M}}](\tau_{1,n}, \tau_{2,n}))^2 \qquad (4)$$

where $S(\tau_{1,n},\tau_{2,n})$ represents the echo amplitudes and $\tilde{F}[P_{\mathcal{M}}](\tau_{1,n},\tau_{2,n})$ represents the modeled measurement. This inversion problem may be summarized, for example, as follows:

$$\underset{P_{\mathcal{M}'}}{\operatorname{argmin}} J_L\big(S(P_{\mathcal{A}}),\, \tilde{F}[P_{\mathcal{M}'}](P_{\mathcal{A}})\big) \qquad (5)$$

where $|P_{\mathcal{M}'}| \leq M$.

Given the above described inversion, a pulse sequence design optimization may be configured to determine the pulse sequence design parameters $P_{\mathcal{A}}$ such that the inversion may be performed as accurately as possible over an expected set of model parameters $P_{\mathcal{M}}$ (e.g., over an expected set or distribution of NMR measurements). The accuracy of the inversion may be determined by a misfit function $J_U$ between two sets of model parameters $P_{\mathcal{M},0}$ and $P_{\mathcal{M},1}$, $J_U(P_{\mathcal{M},0}, P_{\mathcal{M},1})$ that evaluates the performance of the acquisition design. In the context of the lower-level optimization, $P_{\mathcal{M},0}$ represents the ideal model parameters chosen from a set of models and $P_{\mathcal{M},1}$ represents the corresponding inferred model parameters obtained using a particular acquisition setup. For example, $$\underset{P_{\mathcal{A}}}{\operatorname{argmin}} \mathbb{E}_{P_{\mathcal{M}'}}\Big[J_U\Big(P_{\mathcal{M}'}\underset{\tilde{P}_{\mathcal{M}'}}{\operatorname{argmin}} \mathbb{E}_n\big[J_L\big(\tilde{F}[P_{\mathcal{M}'}](P_{\mathcal{A}}) + n,\, \tilde{F}[\tilde{P}_{\mathcal{M}'}](P_{\mathcal{A}})\big)\big]\Big)\Big] \qquad (6)$$

with constraints on $P_{\mathcal{A}}$ such as the cardinality of $P_{\mathcal{A}}$ is less than or equal to a constant N. Here $\mathbb{E}_{P_{\mathcal{M}}}[\bullet]$ denotes expectation over the set of potential $P_{\mathcal{M}}$ of interest and $\mathbb{E}_n[\bullet]$ denotes expectation over noise. Consequently, the pulse sequence determined is intended to be an optimal one for a predetermined set of solutions that represents all T1-T2 distributions of interest as well as expected noises n.

The foregoing may be rewritten as a bilevel optimization problem $$\underset{P_{\mathcal{A}}}{\operatorname{argmin}} \mathbb{E}_{P_{\mathcal{M}'}} J_U(P_{\mathcal{M}'},\, \tilde{P}_{\mathcal{M}'}[P_{\mathcal{A}}]) \qquad (7)$$

where $\tilde{P}_{\mathcal{M}'}|P_{\mathcal{A}}| = \underset{\tilde{P}_{\mathcal{M}'}}{\operatorname{argmin}} \mathbb{E}_n\big[J_L\big(\tilde{F}|P_{\mathcal{M}'}|(P_{\mathcal{A}}) + n,\, \tilde{F}|\tilde{P}_{\mathcal{M}'}|(P_{\mathcal{A}})\big)\big]$, $$|P_{\mathcal{M}'}| \leq M,$$

$$|\tilde{P}_{\mathcal{M}'}| \leq M, \text{ and}$$

$$|P_{\mathcal{A}}| = N.$$

In Eq. (7) $J_U$ and $J_L$ represent upper-level and lower-level optimization problems. These problems may be addressed in a computationally manageable fashion similar to the lower-level problem by combining a greedy variational approach with automatic differentiation methods.

It will be appreciated that formation properties and the corresponding reservoir fluid properties can change significantly as a function of wellbore depth during a drilling operation. Moreover, such changes can be sharp such that large changes can occur over a small depth interval. For example, significant changes are often observed when drilling through a boundary, such as a boundary between sandstone and shale layers. It may therefore be advantageous to update or reconfigure the set of expected NMR measurements from time to time during a drilling operation.

FIG. 6 depicts a flow chart of another example method 120 for automatically determining an NMR pulse sequence.

Method 120 is similar to method 100 in that it includes evaluating a set of expected NMR measurements to determine a pulse sequence. As described above with respect to FIG. 5 a set of expected NMR measurements is received at 122 and evaluated at 124 by solving an optimization problem (such as a bilevel optimization) to compute an advantageous pulse sequence for making the NMR measurements (e.g., an optimal pulse sequence). NMR measurements are made in a wellbore at 126 using the pulse sequence determined in 124 to determine, for example, a T1-T2 map or other NMR measurements.

The NMR measurements may be evaluated at 130 to determine whether or not the measurements are within the set of expected NMR measurements received at 122. When the NMR measurements made at 126 are within the set of expected NMR measurements received at 122 then the method returns to 126 to make another NMR measurement. When the NMR measurements made at 126 are not within the set of expected NMR measurements received at 122 then the method updates (e.g., replaces or reconfigures) the set of expected NMR measurements at 132 and returns to 124 to compute a new pulse sequence for making the NMR measurements. In example embodiments, updating the set of expected NMR measurements may include supplementing (or reconfiguring) the previous set with the new NMR measurements. In other example embodiments, updating the set of expected NMR measurements may include replacing the previous set with the new NMR measurements (or with a new set generated from the new NMR measurements).

Figure 7:
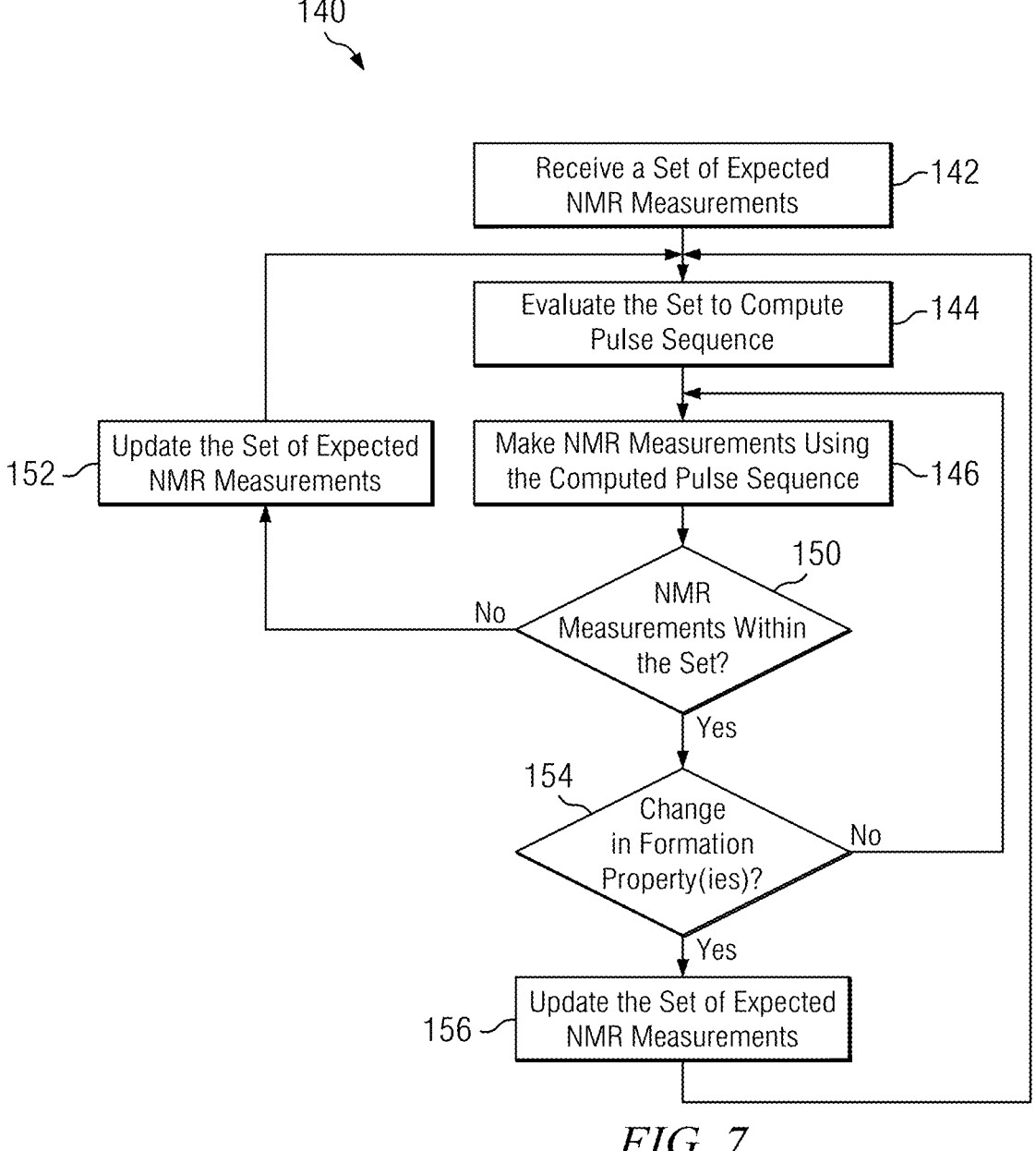
FIG. 7 depicts a flow chart of still another example method for automatically determining an NMR pulse sequence.

FIG. 7 depicts a flow chart of still another example method 140 for automatically determining an NMR pulse sequence. Method 140 is similar to method 120 in that it provides for updating the set of expected NMR measurements. As described above with respect to FIGS. 5 and 6, a set of expected NMR measurements is received at 142 and evaluated at 144 by solving an optimization problem (such as a bilevel optimization) to compute an advantageous pulse sequence for making the NMR measurements (e.g., an optimal pulse sequence). NMR measurements are made in a wellbore at 146 using the pulse sequence determined in 144 to determine, for example, a T1-T2 map or other NMR measurements.

The NMR measurements may be evaluated at 150 to determine whether or not the measurements are within the set of expected NMR measurements received at 142. When the NMR measurements made at 146 are not within the set of expected NMR measurements received at 142 then the method updates (e.g., replaces or reconfigures) the set of expected NMR measurements at 152 and returns to 144 to compute a new pulse sequence for making the NMR measurements (e.g., as described above with respect to FIG. 6). When the NMR measurements made at 146 are within the set of expected NMR measurements received at 142 then the method continues to 154.

Additional logging measurements are also made at 146, for example, including electromagnetic logging measurements, resistivity logging measurements, nuclear logging measurements, and sonic or ultrasonic logging measurements. These measurements are evaluated at 154 to determine whether or not there has been a change in a formation property or properties that exceeds a threshold. When the NMR measurements made at 146 are within the set of expected NMR measurements received at 142 and there has been no significant change to the logging measurements, the method returns to 146 to make another NMR measurement. When the logging measurements made at 146 indicate a change to a formation property (or properties) that exceeds the threshold, the logging measurements are further evaluated at 156 to update (e.g., to replace or reconfigure) the set of expected NMR measurements. For example, the logging measurements may be evaluated to estimate expected NMR measurements which may be used to update the set of expected NMR measurements. In one example embodiment the logging measurements may be evaluated using a correlation (e.g., developed using historical data) that predicts expected NMR measurements from the logging measurements.

It will be appreciated by those of ordinary skill that the disclosed methods may be used to automatically generate substantially any NMR sequence suitable for use in downhole NMR applications, such as with phase alternating pair sequences (PAPS), non-phase alternating pair sequences (non-PAPS), and pseudo-phase alternating pair sequences (pseudo-PAPS), for example, as disclosed in commonly assigned U.S. Patent Publication 2021/0003734.

It will be understood that the present disclosure includes numerous embodiments. These embodiments include, but are not limited to, the following embodiments.

In a first embodiment, a method for automatically determining a pulse sequence for a downhole nuclear magnetic resonance (NMR) measurement includes receiving a set of expected NMR measurements; and evaluating the received set of expected NMR measurements using a bilevel optimization to determine a pulse sequence for the downhole NMR measurement, the pulse sequence defining a timing sequence of a transmission of radio-frequency (RF) pulses during the downhole NMR measurement.

A second embodiment may include the first embodiment, wherein the pulse sequence is defined by wait times between sub-sequences of RF pulses, a number of RF pulses in each sub-sequence of RF pulses, and a time interval between adjacent ones of the RF pulses.

A third embodiment may include any one of the first through second embodiments, wherein the set of expected NMR measurements includes a set of echo amplitudes, a set of T1 relaxation times, and a set of T2 relaxation times.

A fourth embodiment may include the third embodiment, wherein a T1-T2 distribution is modeled as a Dirac delta function.

A fifth embodiment may include any one of the first through fourth embodiments, wherein the receiving the set of expected NMR measurements further comprises receiving an expected measurement noise.

A sixth embodiment may include any one of the first through fifth embodiments, wherein a lower level optimization in the bilevel optimization computes an optimum set of NMR measurements given a particular pulse sequence and the expected measurement noise.

A seventh embodiment may include the sixth embodiment, wherein an upper level optimization in the bilevel optimization computes an optimum pulse sequence such that the optimum set of NMR measurements computed in the lower optimization most closely matches the set of expected NMR measurements.

An eighth embodiment may include any one of the first through seventh embodiments, further comprising making a downhole NMR measurement using the determined pulse sequence.

A ninth embodiment may include the eighth embodiment, further comprising evaluating the NMR measurements made using the determined pulse sequence to update the set of expected NMR measurements; and repeating the evaluating.

A tenth embodiment may include any one of the eighth or ninth embodiments, further comprising making other downhole logging measurements; evaluating the other downhole logging measurements to update the set of expected NMR measurements; and repeating the evaluating.

In an eleventh embodiment a system for making downhole nuclear magnetic resonance (NMR) measurements includes an NMR logging tool including an antenna configured for transmitting a radio frequency (RF) pulse sequence and receiving corresponding echoes; a processor configured to receive a set of expected NMR measurements; and evaluate the received set of expected NMR measurements using a bilevel optimization to determine the pulse sequence for the downhole NMR measurement, the pulse sequence defining a timing sequence of a transmission of RF pulses during the downhole NMR measurement.

A twelfth embodiment may include the eleventh embodiment, wherein the pulse sequence is defined by wait times between sub-sequences of RF pulses, a number of RF pulses in each sub-sequence of RF pulses, and a time interval between adjacent ones of the RF pulses.

A thirteenth embodiment may include any one of the eleventh through twelfth embodiments, wherein the set of expected NMR measurements includes a set of echo amplitudes, a set of T1 relaxation times, and a set of T2 relaxation times.

A fourteenth embodiment may include any one of the eleventh through thirteenth embodiments, wherein the receiving the set of expected NMR measurements further comprises receiving an expected measurement noise; a lower level optimization in the bilevel optimization computes an optimum set of NMR measurements given a particular pulse sequence and the expected measurement noise; and an upper level optimization in the bilevel optimization computes an optimum pulse sequence such that the optimum set of NMR measurements computed in the lower optimization most closely matches the set of expected NMR measurements.

A fifteenth embodiments may include any one of the eleventh through fourteenth embodiments, wherein the processor is further configured to evaluate NMR measurements made using the determined pulse sequence to update the set of expected NMR measurements; and repeat the evaluating.

In a sixteenth embodiment a method for making downhole nuclear magnetic resonance (NMR) measurements includes receiving a set of expected NMR measurements; evaluating the received set of expected NMR measurements using a bilevel optimization to determine a pulse sequence for the downhole NMR measurement, the pulse sequence defining a timing sequence of a transmission of radio-frequency (RF) pulses during the downhole NMR measurement; making the downhole NMR measurements using the determined pulse sequence; evaluating the NMR measurements made using the determined pulse sequence to update the set of expected NMR measurements; and repeating the evaluating.

A seventeenth embodiment may include the sixteenth embodiment, further comprising making other downhole logging measurements; evaluating the other downhole logging measurements to update the set of expected NMR measurements; and repeating the evaluating.

An eighteenth embodiment may include any one of the sixteenth through seventeenth embodiments, wherein the pulse sequence is defined by wait times between sub-sequences of RF pulses, a number of RF pulses in each sub-sequence of RF pulses, and a time interval between adjacent ones of the RF pulses.

A nineteenth embodiment may include any one of the sixteenth through eighteenth embodiments, wherein the set of expected NMR measurements includes a set of echo amplitudes, a set of T1 relaxation times, and a set of T2 relaxation times.

A twentieth embodiment may include any one of the sixteenth through 19 embodiments, wherein the receiving the set of expected NMR measurements further comprises receiving an expected measurement noise; a lower level optimization in the bilevel optimization computes an optimum set of NMR measurements given a particular pulse sequence and the expected measurement noise; and an upper level optimization in the bilevel optimization computes an optimum pulse sequence such that the optimum set of NMR measurements computed in the lower optimization most closely matches the set of expected NMR measurements.

Although automated determination of an NMR pulse sequence has been described in detail, it should be understood that various changes, substitutions and alternations can be made herein without departing from the spirit and scope of the disclosure as defined by the appended claims.

What is claimed is:

1. A method for automatically determining a pulse sequence for a downhole nuclear magnetic resonance (NMR) measurement, the method comprising:
receiving a set of expected NMR measurements;
evaluating the received set of expected NMR measurements using a bilevel optimization to determine the pulse sequence for the downhole NMR measurement, the pulse sequence defining a timing sequence of a transmission of radio-frequency (RF) pulses during the downhole NMR measurement, wherein a lower level optimization in the bilevel optimization computes an optimum set of NMR measurements given a particular pulse sequence and an expected measurement noise;
making a downhole NMR measurement using the determined pulse sequence;
evaluating the NMR measurements made using the determined pulse sequence to update the set of expected NMR measurements; and
repeating the evaluating.

2. The method of claim 1, wherein the pulse sequence is defined by wait times between sub-sequences of RF pulses, a number of RF pulses in each sub-sequence of RF pulses, and a time interval between adjacent ones of the RF pulses.

3. The method of claim 1, wherein the set of expected NMR measurements includes a set of echo amplitudes, a set of T1 relaxation times, and a set of T2 relaxation times.

4. The method of claim 3, wherein a T1-T2 distribution is modeled as a Dirac delta function.

5. The method of claim 1, wherein the receiving the set of expected NMR measurements further comprises receiving the expected measurement noise.

6. The method of claim 1, wherein an upper level optimization in the bilevel optimization computes an optimum pulse sequence such that the optimum set of NMR measurements computed in the lower optimization most closely matches the set of expected NMR measurements.

7. The method of claim 1, further comprising:
making other downhole logging measurements;
evaluating the other downhole logging measurements to update the set of expected NMR measurements; and
repeating the evaluating.

8. A system for making downhole nuclear magnetic resonance (NMR) measurements, the system comprising:
an NMR logging tool including an antenna configured for transmitting a radio frequency (RF) pulse sequence and receiving corresponding echoes;

a processor configured to:
receive a set of expected NMR measurements;
evaluate the received set of expected NMR measurements using a bilevel optimization to determine the RF pulse sequence for the downhole NMR measurement, the RF pulse sequence defining a timing sequence of a transmission of RF pulses during the downhole NMR measurement,
make the downhole NMR measurement using the determined RF pulse sequence,
evaluate NMR measurements made using the determined RF pulse sequence to update the set of expected NMR measurements; and
repeat the evaluating, wherein:
the receiving the set of expected NMR measurements further comprises receiving an expected measurement noise;
a lower level optimization in the bilevel optimization computes an optimum set of NMR measurements given a particular pulse sequence and the expected measurement noise; and
an upper level optimization in the bilevel optimization computes an optimum pulse sequence such that the optimum set of NMR measurements computed in the lower optimization most closely matches the set of expected NMR measurements.

9. The system of claim 8, wherein the RF pulse sequence is defined by wait times between sub-sequences of RF pulses, a number of RF pulses in each sub-sequence of RF pulses, and a time interval between adjacent ones of the RF pulses.

10. The system of claim 8, wherein the set of expected NMR measurements includes a set of echo amplitudes, a set of T1 relaxation times, and a set of T2 relaxation times.

11. A method for making downhole nuclear magnetic resonance (NMR) measurements, the method comprising:
receiving a set of expected NMR measurements;
evaluating the received set of expected NMR measurements using a bilevel optimization to determine a pulse sequence for the downhole NMR measurements, the pulse sequence defining a timing sequence of a transmission of radio-frequency (RF) pulses during the downhole NMR measurements;
making the downhole NMR measurements using the determined pulse sequence;
evaluating the downhole NMR measurements made using the determined pulse sequence to update the set of expected NMR measurements; and
repeating the evaluating, wherein:
the receiving the set of expected NMR measurements further comprises receiving an expected measurement noise;
a lower level optimization in the bilevel optimization computes an optimum set of NMR measurements given a particular pulse sequence and the expected measurement noise; and
an upper level optimization in the bilevel optimization computes an optimum pulse sequence such that the optimum set of NMR measurements computed in the lower optimization most closely matches the set of expected NMR measurements.

12. The method of claim 11, further comprising:
making other downhole logging measurements;
evaluating the other downhole logging measurements to update the set of expected NMR measurements; and
repeating the evaluating.

13. The method of claim 11, wherein the pulse sequence is defined by wait times between sub-sequences of RF pulses, a number of RF pulses in each sub-sequence of RF pulses, and a time interval between adjacent ones of the RF pulses.

14. The method of claim 11, wherein the set of expected NMR measurements includes a set of echo amplitudes, a set of T1 relaxation times, and a set of T2 relaxation times.

* * * * *